US012787366B2

(12) United States Patent
Kang

(10) Patent No.: US 12,787,366 B2
(45) Date of Patent: Nov. 3, 2026

(54) NON-VOLATILE SEMICONDUCTOR MEMORY DEVICE AND MANUFACTURING METHOD THEREOF

(71) Applicant: SK keyfoundry Inc., Cheongju-si (KR)

(72) Inventor: Yangbeom Kang, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 394 days.

(21) Appl. No.: 18/483,720

(22) Filed: Oct. 10, 2023

(65) Prior Publication Data

US 2024/0282832 A1 Aug. 22, 2024

(30) Foreign Application Priority Data

Feb. 21, 2023 (KR) ........................ 10-2023-0022931

(51) Int. Cl.
*H10D 30/68* (2025.01)
*H10B 41/30* (2023.01)
*H10D 64/01* (2025.01)

(52) U.S. Cl.
CPC ......... *H10D 30/6892* (2025.01); *H10B 41/30* (2023.02); *H10D 64/021* (2025.01)

(58) Field of Classification Search
CPC ............... H10D 30/0411; H10D 30/68; H10D 30/6891; H10D 30/6892; H10D 30/6893; H10D 30/6894; H10D 30/681; H10D 30/682; H10D 30/683; H10D 30/684; H10D 30/685; H10D 30/686; H10D 30/687; H10D 30/688; H10D 30/689; H10D 30/696
See application file for complete search history.

(56) References Cited

U.S. PATENT DOCUMENTS 7,611,941 B1 11/2009 Shum et al.
9,343,468 B1 5/2016 Bo et al.
2010/0163965 A1* 7/2010 Kwon ................ H10D 30/0411 257/E21.409
2011/0070725 A1 3/2011 Power et al.
2011/0070726 A1 3/2011 Dickenscheid et al.
2014/0097480 A1* 4/2014 Shum ..................... H10B 41/30 438/257
2017/0330889 A1* 11/2017 Richter .................. H10B 41/50
2018/0366551 A1* 12/2018 Fang .................... H10D 30/696
2021/0119024 A1 4/2021 Lin et al.
2021/0225857 A1 7/2021 Yang et al.
2022/0359674 A1 11/2022 Cho et al.

FOREIGN PATENT DOCUMENTS

KR 10-2022-0152058 A 11/2022

OTHER PUBLICATIONS

Korean Office Action Issued on Feb. 27, 2026, in Counterpart Korean Patent Application No. 10-2023-0022931 (5 Pages in English, 5 Pages in Korean).

* cited by examiner

*Primary Examiner* — Eric A. Ward
(74) *Attorney, Agent, or Firm* — NSIP Law

(57) ABSTRACT

A semiconductor device includes a source region and a drain region disposed in a substrate, a gate stack including a floating gate and a control gate disposed between the source region and the drain region, a select gate insulating layer disposed on a sidewall of the gate stack, and a select gate disposed on the select gate insulating layer, the select gate having a height higher than a height of the gate stack or a height of the control gate.

7 Claims, 10 Drawing Sheets

NON-VOLATILE SEMICONDUCTOR MEMORY DEVICE AND MANUFACTURING METHOD THEREOF

CROSS-REFERENCE TO RELATED APPLICATION

This application claims the benefit under 35 USC § 119(a) of Korean Patent Application No. 10-2023-0022931 filed Feb. 21, 2023, in the Korean Intellectual Property Office, the entire disclosure of which is incorporated herein for all purposes.

BACKGROUND

1. Field Various

Embodiments of this disclosure relate to a structure and manufacturing method of a non-volatile semiconductor memory device.

2. Description of Related Art

A typical non-volatile semiconductor memory device includes a gate stack including a source, a drain, and a control gate, and a select gate electrically isolated from the gate stack. Silicide layers can be formed on the control gate and select gate to reduce resistance, and the bit lines, control gates and select gates are subsequently formed. During the process of forming the silicide layers, overgrowth of silicide layers between the control gate and select gate can lead to leakage current or short circuit between the control gate and select gate.

An excessive over-etching process on the select gates may be required to ensure a space between the control gate and select gate. However, excessive over etching on the select gates may decrease a cross-sectional area of the select gates, which results in increasing a sharpness of the select gates shape.

Therefore, there is a need for techniques that are capable of reducing the sharpness of the select gates shape without excessively over etching the select gate.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect of the disclosure, a semiconductor device includes: a source region and a drain region disposed in a substrate; a gate stack including a floating gate and a control gate disposed between the source region and the drain region; a select gate insulating layer disposed on a sidewall of the gate stack; and a select gate disposed on the select gate insulating layer, the select gate having a height higher than a height of the gate stack or a height of the control gate.

A select gate silicide layer may be disposed on the select gate, and a control gate silicide layer may be disposed on the control gate, the control gate silicide layer having a lateral length smaller than a lateral length of the control gate.

The semiconductor device may further include: a first spacer disposed on a sidewall of the select gate, and disposed adjacent to the source region; a second spacer disposed on an opposite sidewall of the select gate, and extending on a top surface of the gate stack; and a third spacer disposed on an opposite sidewall of the gate stack, and disposed adjacent to the drain region.

The second spacer may be disposed between the select gate silicide layer and the control gate silicide layer.

The second spacer may contact the select gate silicide layer, the control gate silicide layer and the control gate.

The second spacer may have a height higher than a height of the first spacer or a height of the third spacer.

In another general aspect of the disclosure, a method for fabricating a semiconductor device includes: forming a gate stack on a substrate, the gate stack comprising a floating gate and a control gate; forming a select gate insulating layer on a sidewall of the gate stack; forming a select gate on the select gate insulating layer, the select gate having a height higher than a height of the gate stack; and forming spacers on substrate, the spacers including a first spacer disposed on a sidewall of the select gate, a second spacer disposed on an opposite sidewall of the select gate, and extending on a top surface of the gate stack, and a third spacer disposed on an opposite sidewall of the gate stack; and forming a source region and a drain region adjacent to the first spacer and third spacer, respectively.

The method may further include: forming a stacked layer on the substrate; forming a hard mask pattern on the stacked layer; and performing an etching process to the stacked layer implemented by the hard mask pattern to form the gate stack.

The method may further include: forming a select gate silicide layer on the select gate; and forming a control gate silicide layer on the control gate, the control gate silicide layer having a lateral length smaller than a lateral length of the control gate.

The second spacer may be disposed between the select gate silicide layer and the control gate silicide layer.

The second spacer may have a height higher than a height of the first spacer or a height of the third spacer.

In another aspect of the disclosure, a method for fabricating a semiconductor device includes: forming a gate stack on a substrate, the gate stack comprising a floating gate and a control gate; forming a select gate insulating layer on a sidewall of the gate stack; forming a select gate on the select gate insulating layer, the select gate having a first height higher than a height of the gate stack and a second height being similar to that of the gate stack; forming lightly doped regions in the substrate; forming spacers on substrate, the spacers including a first spacer disposed on a sidewall of the select gate, a second spacer disposed on an opposite sidewall of the select gate, and extending on a top surface of the gate stack, and a third spacer disposed on an opposite sidewall of the gate stack; and forming a source region and a drain region adjacent to the first spacer and third spacer.

The method may further include: forming a select gate silicide layer on the select gate; and forming a control gate silicide layer on the control gate, the control gate silicide layer having a lateral length smaller than a lateral length of the control gate.

The method may further include: depositing an interlayer insulating layer on the gate stack; forming contact plugs in the interlayer insulating layer; and electrically connecting metal wirings to the contact plugs.

An upper surface area of the select gate may be larger than that of the gate stack.

The technical objects of the disclosure are not limited to the aforesaid, and other objects not described herein with be clearly understood by those skilled in the art from the descriptions below.

DETAILED DESCRIPTION

Figure 1:
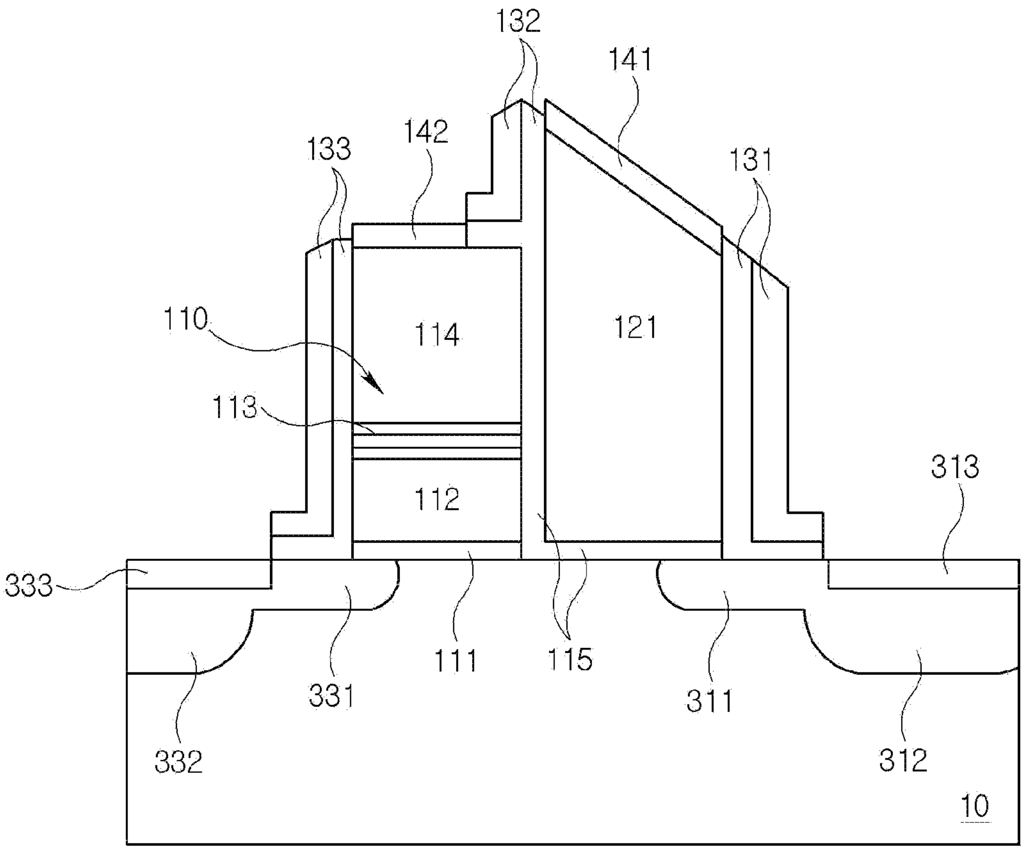
FIG. 1 illustrates a cross-sectional view of a non-volatile semiconductor memory device according to an embodiment of the present invention.

Advantages and features of this disclosure and methods of accomplishing the same may be understood more readily by reference to the detailed descriptions of embodiments that will be made hereinafter with reference to the accompanying drawings. This disclosure may, however, be embodied in many different forms and should not be construed as being limited to the exemplary embodiments set forth herein; rather, these exemplary embodiments are provided so that this disclosure will be thorough and complete and will fully convey the concept of the invention to those skilled in the art, and the present disclosure will only be defined by the appended claims. Throughout the specification, the same reference numerals refer to the same components.

When a component is described as "connected to" or "coupled to" another component, it can refer to a direct connection or coupling with the other component, or to a case where another component is interposed therebetween. Meanwhile, when a component is referred to as "directly connected to" or "directly coupled to" another component, it indicates that there is no other component interposed therebetween. The expression "and/or" is taken to include each of the mentioned items and any combination of one or more.

The terminology used in this specification is for the purpose of describing embodiments, and is not intended to limit the disclosure. In this specification, the singular form includes the plural form unless otherwise specified in the phrase. The "comprises" and/or "comprising" used in the specification do not preclude the presence or addition of one or more other components, steps, operations, and/or devices"

Although the terms "first," "second" and the like are used for describing various components, these components are not confined by these terms. These terms are merely used for distinguishing one component from the other components.

Accordingly, a first component mentioned earlier may also be a second component within the technical spirit of this disclosure. Unless otherwise defined, all terms (including technical and scientific terms) used in this specification are intended to have their common meaning understood by those skilled in the art to which this disclosure belongs. Furthermore, terms that are defined in commonly used dictionaries are generally interpreted in their ordinary and non-excessive sense unless explicitly defined otherwise.

Hereinafter, embodiments of the present invention will be described in detail with reference to accompanying drawings in order for those skilled in the art to easily practice the invention. However, it should be understood that the present invention can be implemented in various forms and is not limited to the embodiments described herein.

FIG. 1 illustrates a cross-sectional view a portion of a non-volatile semiconductor memory device according to an embodiment of the present invention.

According to FIG. 1, a unit cell of a non-volatile semiconductor memory device may include a source region 312 and a drain region 332 disposed to be spaced apart from each other on the upper surface of a substrate 10.

A gate stack 110 may be disposed between the source region 312 and the drain region 332 on the substrate 10. A channel may be disposed between the source region 312 and the drain region 332 by a voltage applied to the gate stack 110 and the select gate 121.

The gate stack 110 may include a tunneling gate insulating layer 111, a floating gate 112, a dielectric layer 113 and a control gate 114. The tunneling gate insulating layer 111, the floating gate 112, the dielectric layer 113 and the control gate 114 are sequentially stacked.

The tunneling gate insulating layer 111 is disposed on the substrate 10, and comprising an oxide film or a nitride film such as $SiO_2$, SiON, SiN.

The floating gate 112 and the control gate 114 may comprise polysilicon. The control gate 114 may have a thickness greater than a thickness of the floating gate 112. For example, the floating gate 112 may have a thickness ranged from 800 to 1200 nm in the thickness. The control gate 114 may have a thickness ranged 1000 to 1800 nm.

The dielectric layer 113 is disposed between the floating gate 112 and the control gate 114. The dielectric layer 113 may comprise a single layer or a stacked structure of silicon oxide (O), silicon nitride (N), and silicon oxide (O), namely ONO.

A select gate insulating layer 115 may be disposed on the substrate 10 and a sidewall of the gate stack 110. Herein, the gate stack 110 comprises the floating gate 112 and the control gate 114, so the select gate insulating layer 115 may be disposed on each sidewall of the floating gate 112 and the control gate 114. A select gate insulating layer 115 may be disposed between the select gate 121 and the gate stack 110, and insulating the select gate 121 from the gate stack 110.

The select gate 121 may be disposed on the select gate insulating layer 115, and having a height higher than a height of the gate stack 110. The select gate 121 may be also disposed on the sidewall of the gate stack 110. The gate stack 110 may comprise the floating gate 112 and a control gate 114. Therefore, the select gate 121 may be also disposed on the sidewall of the floating gate 112 and the control gate 114.

The first spacer 131 may be disposed on a sidewall of the select gate 121. The first spacer 131 may be disposed between the select gate 121 and the source region 312. The first spacer 131 may contact the sidewall of the select gate 121 and a portion of the source region 312 of the substrate 10. Furthermore, the first spacer 131 may contact the source silicide layer 313 and the select gate silicide layer 141. The first spacer 131 may insulate the select gate 121 from the source region 312.

The second spacer 132 may be disposed on an opposite sidewall of the select gate 121 and on a top surface of the control gate 114. The second spacer 132 may contact the opposite sidewall of the select gate 121 and the top surface of the control gate 114. The second spacer 132 may be spaced apart from the first spacer 131. Additionally, the second spacer 132 may contact the control gate silicide layer 142 and the select gate silicide layer 141 as well as the control gate 114. The second spacer 132 may insulate the control gate 114 from the select gate 121 to prevent short-circuit phenomena. Furthermore, the second spacer 132 may insulate the control gate silicide layer 142 from the select gate silicide layer 141 to prevent short-circuit phenomena.

A third spacer 133 may be disposed between the gate stack 110 and the drain region 332. The third spacer 133 may contact an opposite sidewall of the gate stack 110 and a portion of the drain region 332 of the substrate 10. Furthermore, the third spacer 133 may contact the drain silicide layer 333 and the control gate silicide layer 142. The third spacer 133 may insulate the gate stack 110 from the drain region 332.

The first to third spacers 131, 132, and 133 may comprise insulating layers combined with a first silicon oxide and a second silicon nitride. Alternatively, these spacers may comprise triple insulating layers which are a first silicon oxide, a second silicon nitride and a third silicon oxide.

The source region 312 may be disposed adjacent to the select gate 121, the select gate insulating layer 115, and the first spacer 131. On the other hand, the drain region 332 may be disposed adjacent to the floating gate 112, the control gate 114, and the third spacer 133.

The drain silicide layer 333 may be disposed on a portion of the drain region 332. The source silicide layer 313 may be disposed on a portion of the source region 312.

The select gate silicide layer 141 may be disposed on the upper portion of the select gate 121. The select gate silicide layer 141 may be disposed between the first spacer 131 and the second spacer 132.

The control gate silicide layer 142 may be disposed on a portion of the upper part of the gate stack 110 where the second spacer 132 is not disposed. The control gate silicide layer 142 may be disposed on the top surface of the control gate 114. The control gate silicide layer 142 may be disposed between the second spacer 132 and the third spacer 133.

Hereinafter, a manufacturing method of a non-volatile semiconductor memory device according to an embodiment of the present invention will be described.

Figure 2:
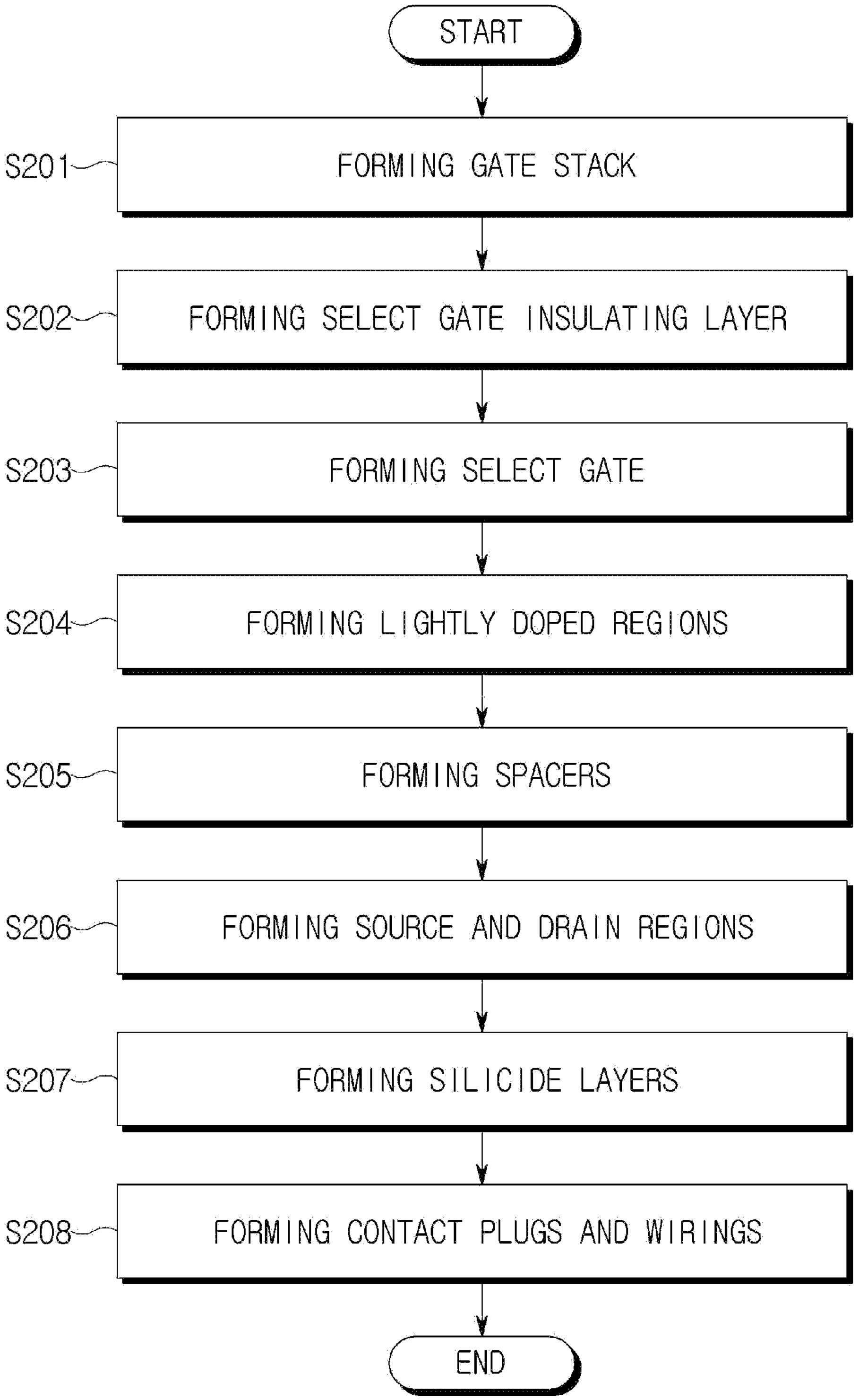
FIG. 2 illustrates a flowchart for a manufacturing method of a non-volatile semiconductor memory device according to an embodiment of the present invention.

FIG. 2 illustrates a flowchart for a manufacturing method of a non-volatile semiconductor memory device according to an embodiment of the present invention.

FIGS. 3 to 18 illustrate a manufacturing method of a non-volatile semiconductor memory device according to an embodiment of the present invention. In FIGS. 3 to 18, the drawings illustrate two unit cells with a symmetrical structure.

Figure 3:
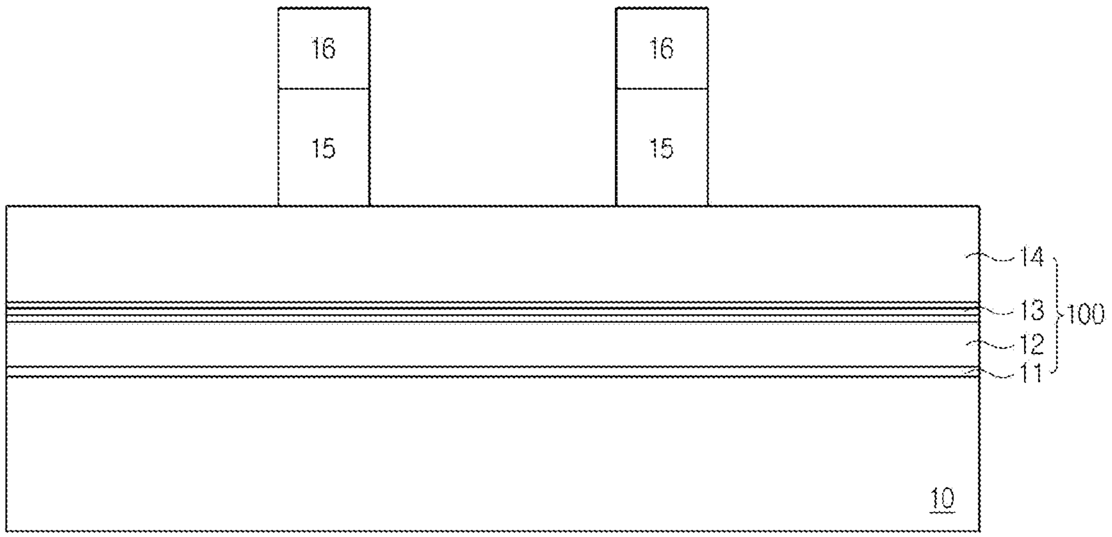
FIGS. 3 to 18 illustrate a manufacturing method of a non-volatile semiconductor memory device according to an embodiment of the present invention.

FIG. 3 illustrates a stacked layer formation process.

According to FIG. 3, to form the stacked layer 100, a tunneling gate insulating layer 11, a first polysilicon layer 12 for a floating gate, a dielectric layer 13, and a second polysilicon layer 14 for a control gate may be sequentially deposited on the substrate 10. The tunneling gate insulating layer 11 may comprise a single layer or a multilayer such as $SiO_2$, SiN, SiON, or high-k materials.

A hard mask pattern 15 and a first photoresist pattern 16 may be formed on the stacked layer 100. For example, the first polysilicon layer 12 may have a thickness ranged from 800 to 1200 nm. The second polysilicon layer 14 may have a thickness ranged from 1000 to 1800 nm.

The hard mask pattern 15 may comprise a single layer or a multilayer of materials such as $SiO_2$, SiON, or other oxide materials. The hard mask pattern 15 may have a thickness ranged from 1000 to 1500 nm.

Figure 4:
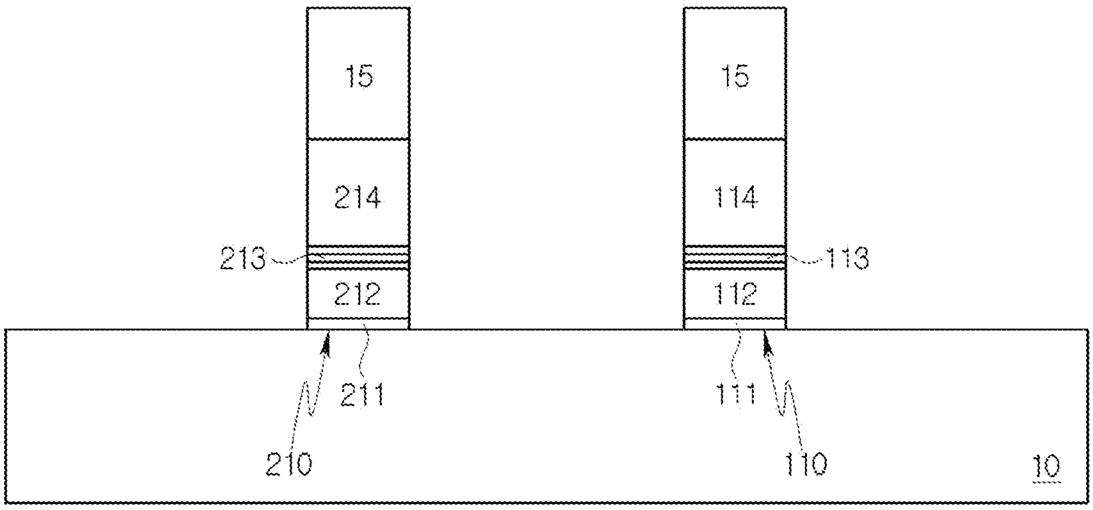

FIG. 4 illustrates an etching process to form gate stacks (step S201).

According to FIG. 4, an etching process is performed on the stacked layer 100 to form a first gate stack 110 and a second gate stack 210 implemented by the hard mask pattern 15 and the first photoresist pattern 16. The first gate stack 110 and the second gate stack 210 may include a tunneling gate insulating layer 111, 211, a floating gate 112, 212, a dielectric layer 113, 213 and a control gate 114. The tunneling gate insulating layer 111, 211, the floating gate 112, 212, the dielectric layer 113, 213, and the control gate 114 are sequentially stacked. After the etching process, the first photoresist pattern 16 may be removed. The hard mask pattern 15 may still remain on each top surface of the first gate stack 110 and the second gate stack 210.

Figure 5:
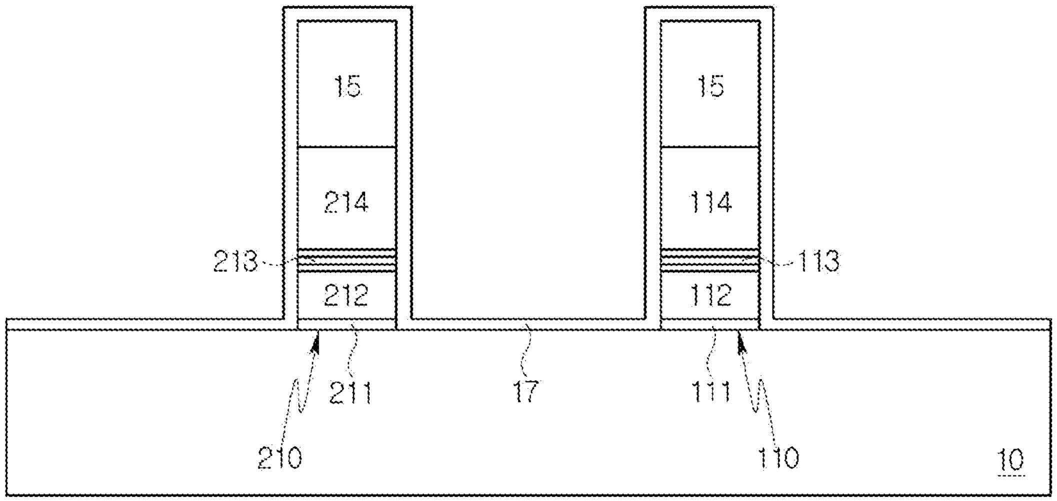

FIG. 5 illustrates a dielectric layer deposition process for forming a select gate insulating layer (step S202).

According to FIG. 5, a select gate insulating layer 17 may be formed to cover the first gate stack 110, the second gate stack 210, and the hard mask pattern 15. The select gate insulating layer 17 may comprise $SiO_2$, SiN, or SiON materials.

Figure 6:
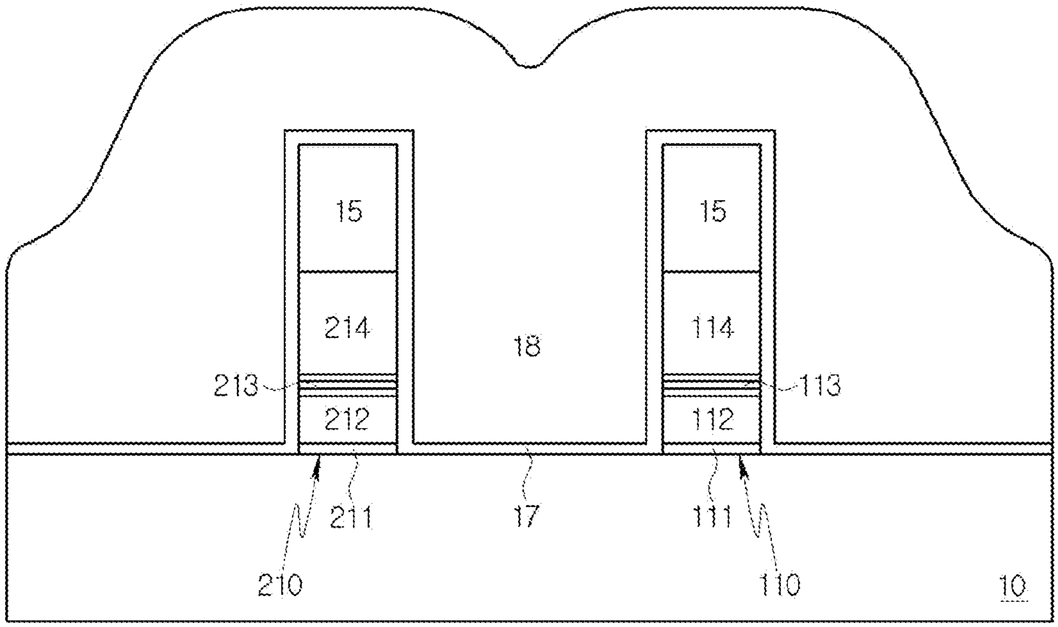

FIG. 6 illustrates a conductive layer deposition process for forming a select gate (step S203).

According to FIG. 6, a conductive layer 18 may be deposited on the upper surface of the select gate insulating layer 17 with a low pressure chemical vapor deposition (LPCVD) method. The conductive layer 18 may comprise an undoped polysilicon or heavily doped polysilicon to form a select gate.

Figure 7:
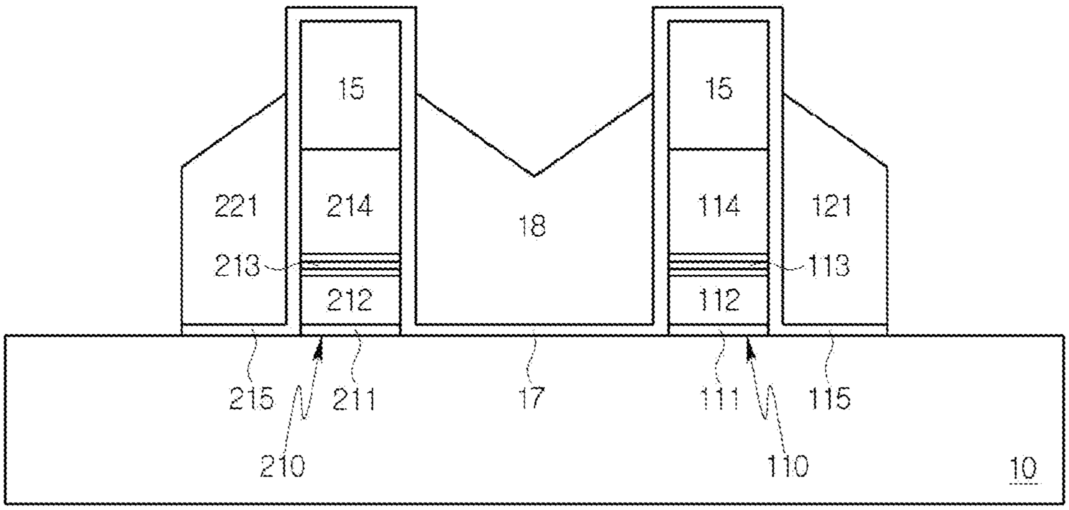

FIG. 7 illustrates an etch-back process to form a first select gate and a second select gate with a spacer shape.

According to FIG. 7, the etch-back process may be performed on the conductive layer 18 to form a first select gate 121 and a second select gate 221. Each top surface of the first and second select gates 121 and 221 may overlap the hard mask pattern 15. The first select gate 121 and the second select gate 221 are disposed on sidewalls of the first and second gate stacks 110 and 210. The recessed conductive layer 18 may still remain between the first and second gate stacks 110 and 210 after the etch-back process.

Figure 8:
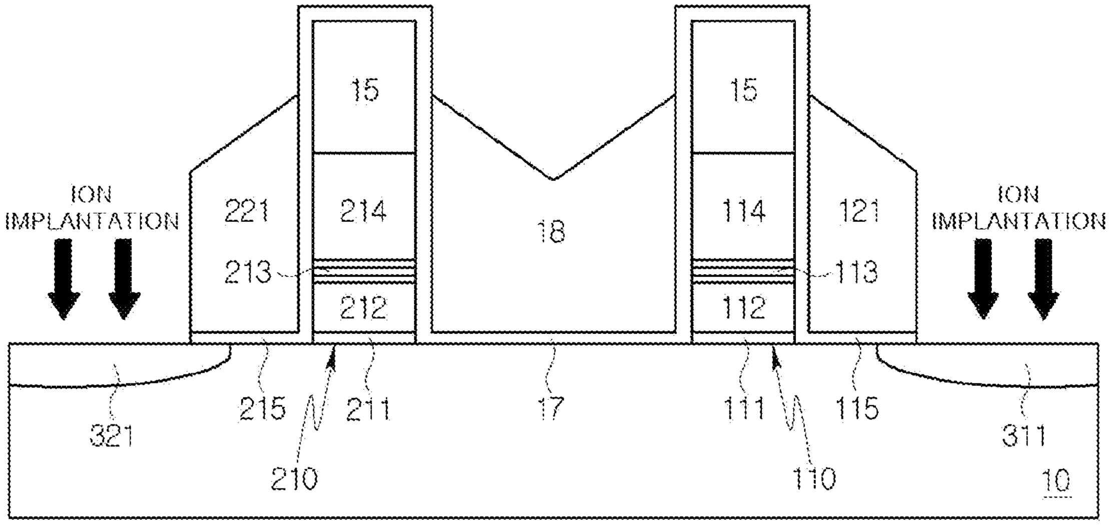

FIG. 8 illustrates an ion implantation process for forming lightly doped regions in the substrate (step 204).

According to FIG. 8, a first lightly doped region 311 and a second lightly doped region 321 may be formed in the substrate 10 by the implantation process.

Figure 9:
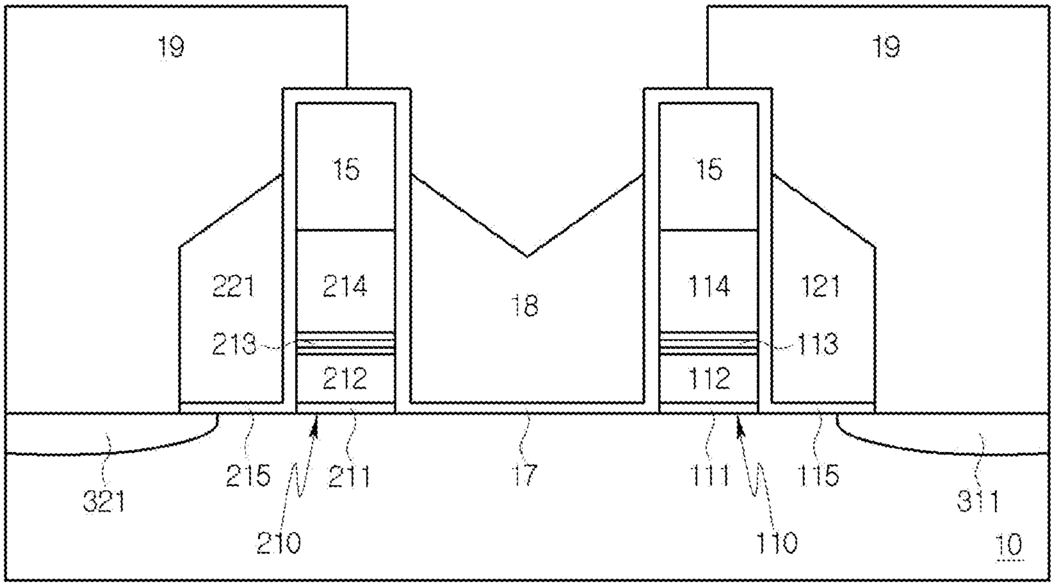

FIG. 9 illustrates a photoresist pattern process on the first select gate and the second select gate.

According to FIG. 9, a photoresist pattern 19 may be formed on the first select gate 121 and the second select gate 221 to open the recessed conductive layer 18 disposed between the first and second gate stacks 110 and 210.

Figure 10:
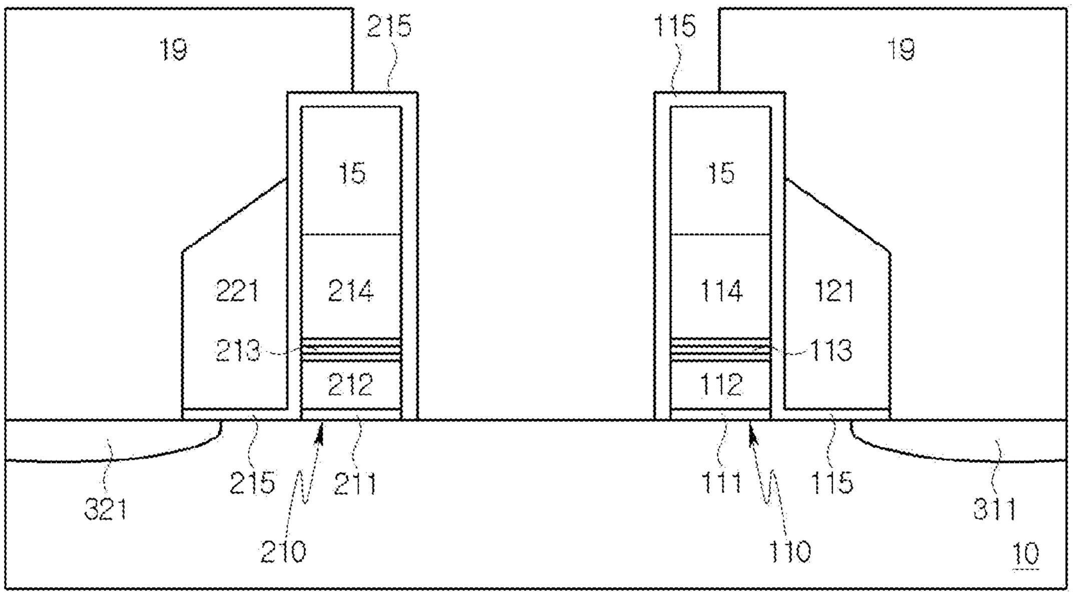

FIG. 10 illustrates a removal process of the recessed conductive layer.

According to FIG. 10, a removal process of the recessed conductive layer 18 is performed with the photoresist pattern 19. For example, a reactive ion etching (RIE) process may be performed for the removal process. During the removal process, the hard mask pattern 15 may protect the first gate stack 110 and the second gate stack 210. A thickness of the hard mask pattern 15 may be reduced by the removal process. The recessed conductive layer 18 may be completely removed after the removal process.

Figure 11:
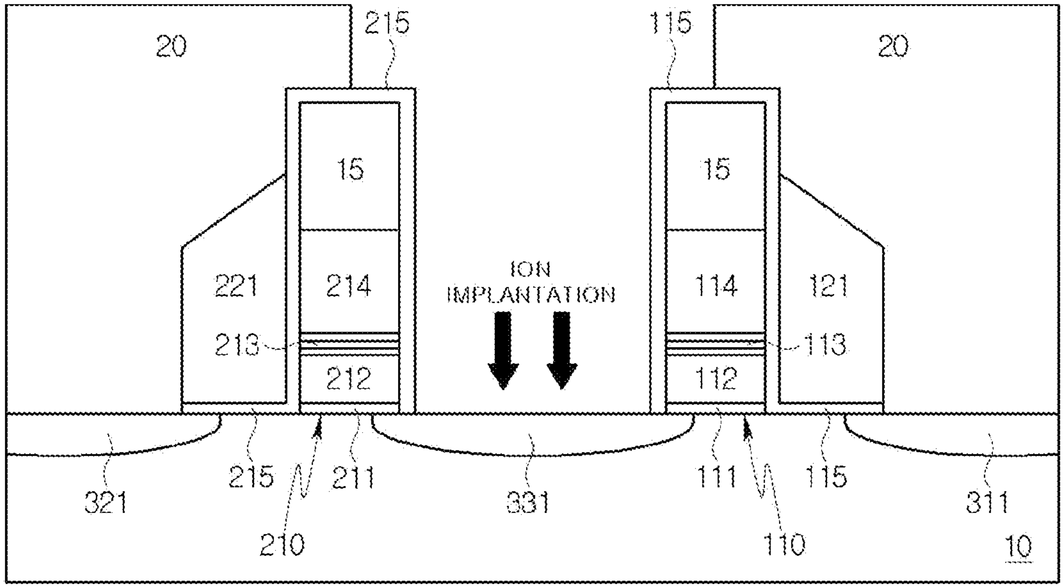

FIG. 11 illustrates an ion implantation process to form a lightly doped region in the substrate.

According to FIG. 11, the ion implantation process is performed to form a third lightly doped region 331 in the substrate 10 implemented by a photoresist pattern 20. The third lightly doped region 331 may be formed between the first gate stack 110 and the second gate stack 210. After the ion implantation process, the photoresist pattern 20 may be removed.

Figure 12:
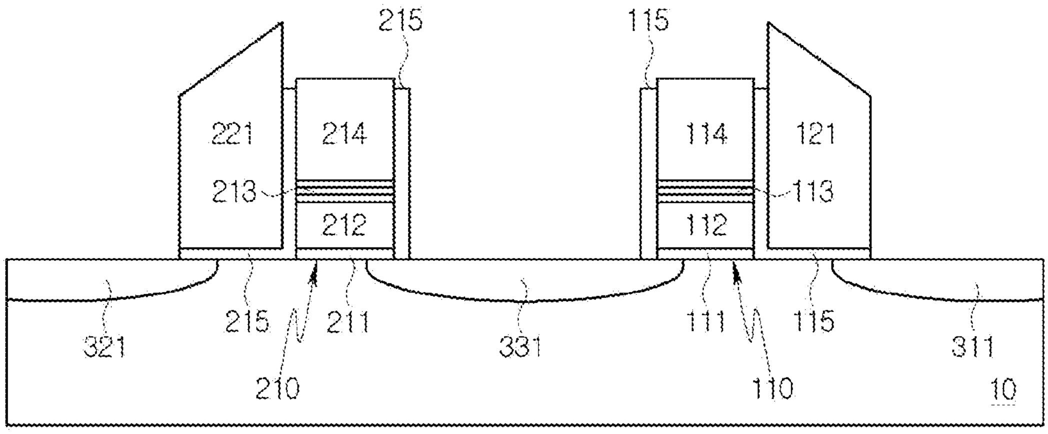

FIG. 12 illustrates a hard mask removal process.

According to FIG. 12, a dry etching or a wet etching for the hard mask removal process is performed on the hard mask pattern 15 disposed on the first gate stack 110 and the second gate stack 210.

Figure 13:
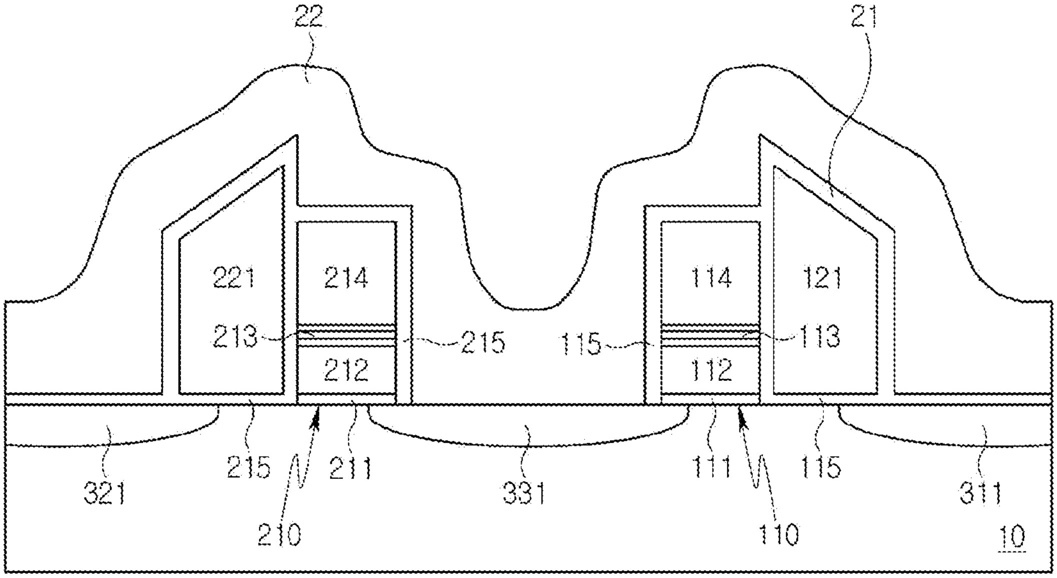

FIG. 13 illustrates an insulating layer deposition process.

According to FIG. 13, a first insulating layer 21 and a second insulating layer 22 may be sequentially deposited on each sidewall of the first gate stack 110, the second gate stack 210, and the select gates 121 and 221 for the insulating layer deposition process.

The first insulating layer 21 and the second insulating layer 22 may comprise a silicon oxide and a silicon nitride layer, respectively. After the insulating layer deposition process, the first and second insulating layers 21 and 22 may contact the control gates 114 and 214 and the select gates 121 and 221. The first and second insulating layers 21 and 22 may also contact the select gate insulating layers 115 and 215.

Figure 14:
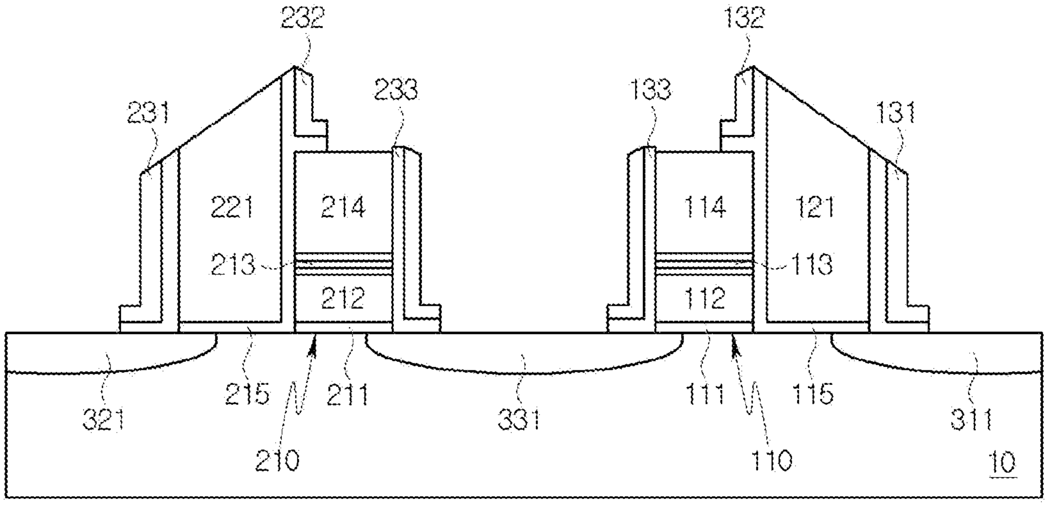

FIG. 14 illustrates an etch-back process to form spacers (S205).

According to FIG. 14, the etch-back process is performed on the first and second insulating layers 21 and 22 for forming first to sixth spacers 131, 132, 133, 231, 232, and 233. Through the etch-back process, the silicon oxide layer 21 and silicon nitride layer 22 are turned to the first to sixth spacers 231-236.

The first spacer 131 may be formed between the first select gate 121 and the first source region 312. The second spacer 132 may be formed on one side of the select gate 121. The second spacer 132 may be formed to be spaced apart from the first spacer 131.

The third spacer 133 may be formed between the first gate stack 110 and the drain region 332. Thus, the third spacer 133 may contact one side of the gate stack 110 and a portion of the drain region 332 of the substrate 10.

The fourth spacer 231 may be symmetrically formed with a respect to the first spacer 131, and disposed between the second select gate 221 and the second source region 322. The fourth spacer 231 may contact one side of the second select gate 221 and a portion of the second source region 322 of the substrate 10.

The fifth spacer 232 may be formed symmetrically with a respect to the second spacer 132, and contacting one side of the second select gate 221. The fifth spacer 232 may be spaced apart from the fourth spacer 231.

The sixth spacer 233 may be formed symmetrically with a respect to the third spacer 133, and disposed between the second gate stack 210 and the drain region 332. The sixth spacer 233 may contact one side of the second gate stack 210 and a portion of the drain region 332 of the substrate 10. Additionally, the third and sixth spacers 133 and 233 may be formed to be spaced apart from each other on the opposite sides of the first and second gate stacks 110 and 210.

Figure 15:
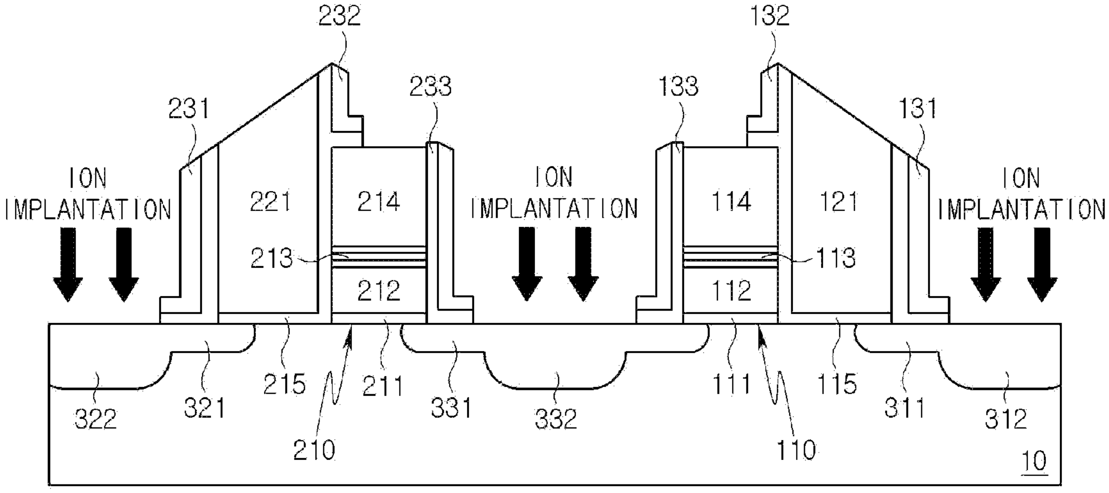

FIG. 15 illustrates an ion implantation process for forming source and drain regions (S206).

According to FIG. 15, the ion implantation process is performed to form first/second source regions 312 and 322 and a drain region 332 in the substrate 10.

The first/second source region 312 may have a doping concentration higher than those of the first/second lightly doped regions 311 and 321. The drain region 332 may also have a doping concentration higher than that of the third lightly doped region 331.

Figure 16:
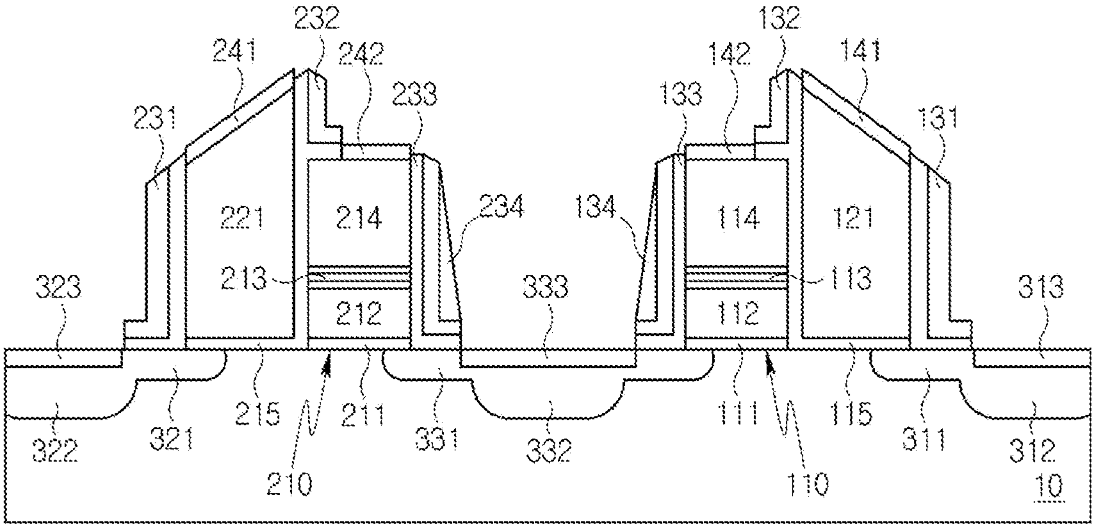

FIG. 16 illustrates a salicide process for forming silicide layers (S207).

According to FIG. 16, insulating layers 134 and 234 may be formed on the substrate 10. The insulating layers 134 and 234 may comprise SiON or SiN material. Then, a salicide process may be performed to form silicide layers.

The silicide layers may comprise select gate silicide layers 141 and 241, control gate silicide layers 142 and 242, source silicide layers 313 and 323, and drain silicide layer 333 on the substrate 10.

The select gate silicide layers 141 and 241 may also be formed on the first/second select gates 121 and 221.

The control gate silicide layers 142 and 242 may be formed on a portion of the upper surface of the first/second control gates 114 and 214. The control gate silicide layers 142 and 242 may be formed in the remaining portion of the upper surface of the first/second control gates 114 and 214 where the second/fifth spacers 132 and 232 are not formed. Thus, the control gate silicide layers 142 and 242 may have a lateral length smaller than a lateral length of the control gates 114 and 214.

The source silicide layers 313 and 323 may be formed on the first/second source regions 312 and 322. The drain silicide layer 333 may be formed on the drain region 332.

Figure 17:
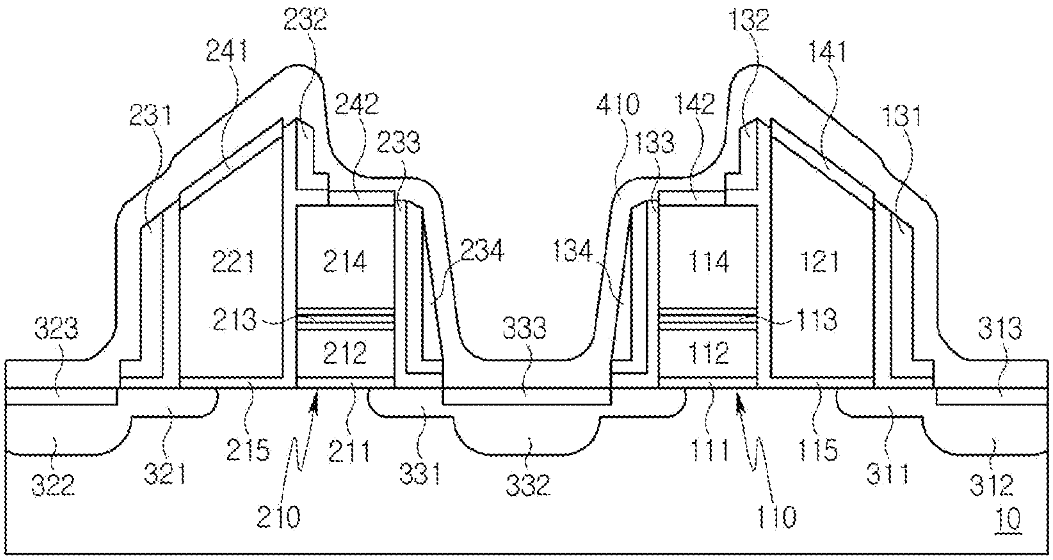

FIG. 17 illustrates an etch stop layer deposition process for contact etching.

According to FIG. 17, an etch stop layer 410 may be formed on the silicide layers 141, 142, 241, 242, 313, 323, and 333. The etch stop layer 410 may serve as an etch stopper in the process of forming contact plugs. The etch stop layer 410 may be formed as a single layer or a dual layer of materials such as $SiO_2$, SiN, SiON, and SiOCN.

Figure 18:
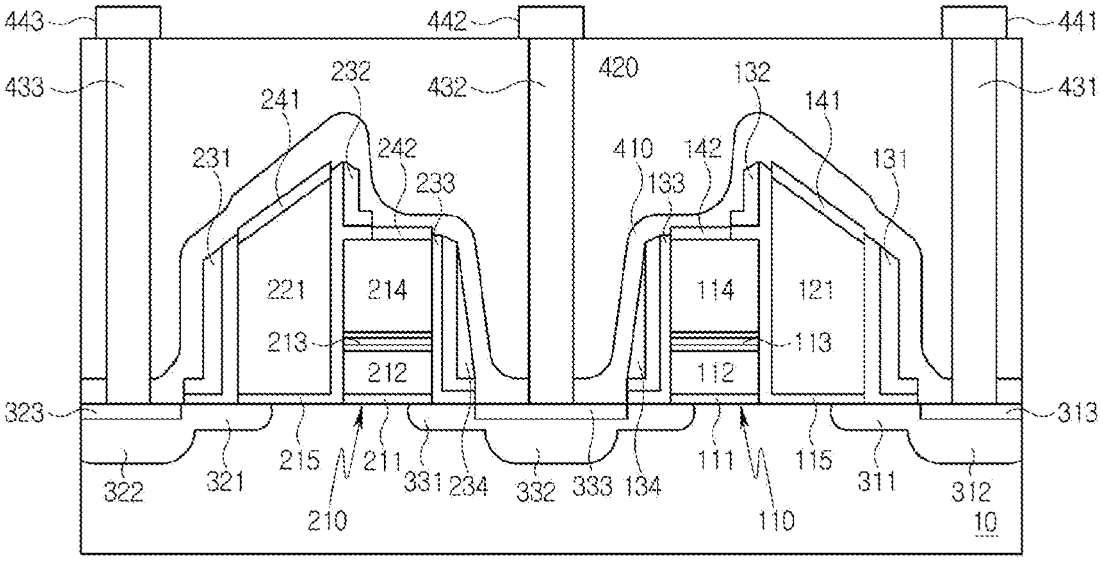

FIG. 18 illustrates a process for forming contact plugs and metal wirings (S208).

According to FIG. 18, an interlayer insulating layer 420 may be deposited on the gate stacks 110/210. Then, the contact plugs 431, 432, 433 are formed in the interlayer insulating layer 420. The contact plugs 431, 432, and 433 may comprise tungsten (W) or copper (Cu), etc.

Metal wirings 441, 442, and 443 are formed on the contact plugs 431, 432, and 433. The metal wirings 441, 442, and 443 may electrically connect to the contact plugs 431, 432, and 433, respectively.

The above-described semiconductor device and manufacturing method thereof according to an embodiment of the present invention is capable of preventing the occurrence of leakage current or short circuit phenomena between the control gate and the select gate due to the overgrowth of silicide, by securing a distance between a control gate and a select gate without excessive over-etching the select gate.

While the description has focused on the embodiments presented in the drawings, it is obvious to those skilled in the art that these embodiments are merely provided for illustrative purposes and various modifications and alternative embodiments equivalent in functionality can be derived therefrom. Therefore, the true scope of protection for this disclosure should be determined by the technical ideas set forth in the attached claims.

What is claimed is:

1. A method for fabricating a semiconductor device, the method comprising:

forming a gate stack on a substrate, the gate stack comprising a floating gate and a control gate disposed on the floating gate;

forming a select gate insulating layer on a sidewall of the gate stack;

forming a select gate on the select gate insulating layer, the select gate having a height higher than a height of the gate stack;

forming spacers on the substrate, the spacers comprising:
a first spacer disposed on a sidewall of the select gate;
a second spacer disposed on an opposite sidewall of the select gate, and extending on a top surface of the gate stack; and
a third spacer disposed on an opposite sidewall of the gate stack;
forming a source region and a drain region adjacent to the first spacer and third spacer, respectively;
forming silicide layers on the substrate, the silicide layers comprising:
a source silicide layer and a drain silicide layer on the source region and the drain region, respectively;
a select gate silicide layer on the select gate; and
a control gate silicide layer on the control gate disposed on the floating gate, the control gate silicide layer having a lateral length smaller than a lateral length of the control gate;
forming an etch stop layer on the spacers and on the silicide layers, wherein the etch stop layer is in direct contact with the source silicide layer, the drain silicide layer, the select gate silicide layer and the control gate silicide layer;
depositing an interlayer insulating layer on the etch stop layer;
forming contact plugs in the interlayer insulating layer; and
electrically connecting metal wirings to the contact plugs,
wherein the second spacer is disposed between the select gate silicide layer and the control gate silicide layer.

2. The method of claim 1, further comprising:
forming a stacked layer on the substrate;
forming a hard mask pattern on the stacked layer; and
performing an etching process to the stacked layer implemented by the hard mask pattern to form the gate stack.

3. The method of claim 1, wherein the second spacer has a height higher than a height of the first spacer or a height of the third spacer.

4. The method of claim 1, further comprising:
forming a buffer insulating layer on the third spacer before the forming the silicide layers on the substrate,
wherein the buffer insulating layer is disposed between the third spacer and the etch stop layer.

5. The method of claim 1, further comprising:
forming a first lightly doped region and a second lightly doped region in the substrate,
wherein the first lightly doped region directly overlaps the select gate, and
wherein the second lightly doped region directly overlaps the floating gate and the control gate.

6. A method for fabricating a semiconductor device, the method comprising:
forming a gate stack on a substrate, the gate stack comprising a floating gate and a control gate disposed on the floating gate;
forming a select gate insulating layer on a sidewall of the gate stack and on the substrate;
forming a select gate on the select gate insulating layer, the select gate having a first height higher than a height of the gate stack and a second height being similar to that of the gate stack;
forming spacers on the substrate, the spacers comprising:
a first spacer disposed on a sidewall of the select gate;
a second spacer disposed on an opposite sidewall of the select gate, and extending on a top surface of the gate stack; and
a third spacer disposed on an opposite sidewall of the gate stack;
forming a source region and a drain region adjacent to the first spacer and third spacer, respectively;
forming silicide layers on the substrate, the silicide layers comprising:
a source silicide layer and a drain silicide layer on the source region and the drain region, respectively;
a select gate silicide layer on the select gate; and
a control gate silicide layer on the control gate disposed on the floating gate, the control gate silicide layer having a lateral length smaller than a lateral length of the control gate;
forming an etch stop layer on the spacers and the silicide layers, wherein the etch stop layer is in direct contact with the source silicide layer, the drain silicide layer, the select gate silicide layer and the control gate silicide layer;
depositing an interlayer insulating layer on the etch stop layer;
forming contact plugs in the interlayer insulating layer; and
electrically connecting metal wirings to the contact plugs,
wherein the second spacer is disposed between the select gate silicide layer and the control gate silicide layer.

7. The method of claim 6, wherein an upper surface area of the select gate is larger than that of the gate stack.

* * * * *